United States Patent
Sasabata et al.

(10) Patent No.: US 6,693,498 B1
(45) Date of Patent: Feb. 17, 2004

(54) SPDT SWITCH AND COMMUNICATION UNIT USING THE SAME

(75) Inventors: Akihiro Sasabata, Nagaokakyo (JP); Shigekazu Okamoto, Nagaokakyo (JP); Motoyasu Nakao, Nagaokakyo (JP)

(73) Assignee: Murata Manufacturing Co. Ltd (JP)

( * ) Notice: Subject to any disclaimer, the term of this patent is extended or adjusted under 35 U.S.C. 154(b) by 73 days.

(21) Appl. No.: 09/760,862

(22) Filed: Jan. 16, 2001

(30) Foreign Application Priority Data

Feb. 22, 2000 (JP) ........................................ 2000-044535

(51) Int. Cl.[7] ............................... H04B 1/44; H01P 1/10
(52) U.S. Cl. ...................... 333/103; 333/101; 333/262; 455/78
(58) Field of Search ................................. 333/103, 101, 333/104, 262; 455/78

(56) References Cited

U.S. PATENT DOCUMENTS 5,969,560 A * 10/1999 Kohama et al. ............ 327/308
6,118,985 A * 9/2000 Kawakyu et al. ............. 455/78

* cited by examiner

*Primary Examiner*—Robert Pascal
*Assistant Examiner*—Stephen E. Jones
(74) *Attorney, Agent, or Firm*—Dickstein Shapiro Morin & Oshinsky

(57) ABSTRACT

An SPDT switch used for a communication unit includes first and second terminals, a common terminal, and first and second FETs with Schottky connection gates. The drain of the first FET is connected to the first terminal, and the source of the second FET is connected to the second terminal. The source of the first FET and the drain of the second FET are directly connected to each other, and are then connected to the common terminal. The pinch-off voltage $V_{p1}$ of the first FET is set to satisfy $0 > V_{p1} > \alpha-\gamma$, and the pinch-off voltage $V_{p2}$ of the second FET is set to satisfy $0 > V_{p2} > \gamma-\beta$, where $\alpha<\gamma<\beta$. A fixed potential $\gamma$ is applied to the gate of the second FET, and one of potentials $\alpha$ and $\beta$ is applied to the gate of the first FET, so that one of the first and second terminals can be electrically connected to the common terminal. Additional resonance and/or switching elements may be included as well.

5 Claims, 4 Drawing Sheets

SPDT SWITCH AND COMMUNICATION UNIT USING THE SAME

BACKGROUND OF THE INVENTION

1. Field of the Invention

The present invention relates to an SPDT (single pole double throw) switch, and a communication unit using the same. More particularly, the present invention relates to an SPDT switch for use in a mobile communication unit as an antenna switch, and to a communication unit using the same.

2. Description of the Related Art

Recent demands to reduce the size and cost of mobile communication units require that single pole double throw (SPDT) switches used as antenna switches be reduced in size and cost. An SPDT switch is a switch having three terminals, one of which is connectable to either of the other two terminals.

FIG. 7 is a circuit diagram showing a conventional SPDT switch disclosed in Japanese Unexamined Patent Application Publication No. 9-23101.

Referring to FIG. 7, an SPDT switch 1 includes a first terminal $P_1$, a second terminal $P_2$, a common terminal $P_3$, a first field-effect transistor (FET) $Q_1$, a second FET $Q_2$, a first inductor $L_1$, a second inductor $L_2$, resistors $R_1$, $R_2$, and $R_3$, a first control terminal $P_4$, a second control terminal $P_5$, and a third control terminal $P_6$. The source of the first FET $Q_1$ is connected to the first terminal $P_1$, and the source of the second FET $Q_2$ is connected to the second terminal $P_2$. The drain of the first FET $Q_1$ and the drain of the second FET $Q_2$ are connected to each other, and are connected to the common terminal $P_3$. The first inductor $L_1$ is connected across the drain and source of the first FET $Q_1$, and the second inductor $L_2$ is connected across the drain and source of the second FET $Q_2$. The gate of the first FET $Q_1$ is connected to the first control terminal $P_4$ via the resistor $R_1$, and the gate of the second FET $Q_2$ is connected to the second control terminal $P_5$ via the resistor $R_2$. The drain of the first FET $Q_1$ and the drain of the second FET $Q_2$ are connected to the third control terminal $P_6$ via the resistor $R_3$. Each of the first FET $Q_1$ and the second FET $Q_2$ has a pinch-off voltage set at −0.5 V. Symbol "D" in FIG. 7 represents the drain.

In the SPDT switch 1 having such a construction, potentials of 0 V, 0 V, and −3 V are applied to the first control terminal $P_4$, the second control terminal $P_5$, and the third control terminal $P_6$, respectively. Then, the first FET $Q_1$ has a potential of 0 V at the drain and source, and the gate-drain (or gate-source) voltage is 0 V, thereby turning on the first FET $Q_1$. The second FET $Q_2$ also has a potential of 0 V at the drain and source, and the gate-drain (or gate-source) voltage is −3 V, which is less than the pinch-off voltage, thus turning off the second FET $Q_2$. In the off state, the second FET $Q_2$ has an off-capacitance across the drain and source. The inductance of the second inductor $L_2$ is set so that the second inductor $L_2$ may form a parallel resonance with the off-capacitance of the second FET $Q_2$ having a resonant frequency synchronous with the frequency of an undesired signal. In theory, infinite impedance is thus obtained across the drain and source of the second FET $Q_2$ at the frequency of such an undesired signal. Therefore, an electrical connection is established between the first terminal $P_1$ and the common terminal $P_3$ via the first FET $Q_1$, and no electrical connection occurs between the second terminal $P_2$ and the common terminal $P_3$ because infinite impedance is obtained at the parallel resonance between the off-capacitance of the second FET $Q_2$ and the second inductor $L_2$.

On the other hand, suppose that potentials of −3 V, 0 V, and 0 V are applied to the first control terminal $P_4$, the second control terminal $P_5$, and the third control terminal $P_6$, respectively. In contrast to the previous description, an electrical connection between the second terminal $P_2$ and the common terminal $P_3$ is established via the second FET $Q_2$, and no electrical connection occurs between the first terminal $P_1$ and the common terminal $P_3$ because infinite impedance is obtained by the parallel resonance between the off-capacitance of the first FET $Q_1$ and the first inductor $L_1$.

The SPDT switch 1 therefore allows either one of the first terminal $P_1$ and the second terminal $P_2$ to be electrically connected to the common terminal $P_3$ by changing the voltages to be applied to the first control terminal $P_4$ and to the second control terminal $P_5$.

However, the SPDT switch 1 shown in FIG. 7 is disadvantageous in that two potentials of 0 V and −3 V must be alternately applied to the first control terminal $P_4$ and the second control terminal $P_5$. In other words, while 0 V or −3 V is applied to the first control terminal $P_4$, −3 V or 0 V must be simultaneously applied to the second control terminal $P_5$. Specifically, two control lines adapted to change the potentials to be applied to the respective terminals are required, or otherwise, a single control line branched into two and configured so that either signal may be inverted is required.

In such cases, an increased area may be required for such a control line(s). Otherwise, an extra control port such as a CPU (central processing unit) or logic for allowing a control signal to be inverted may be required, thus, making it difficult to reduce the size and cost of the switch.

SUMMARY OF THE INVENTION

Accordingly, the present invention provides an SPDT switch which can be easily controlled and which is compact, and a communication unit using the same.

To this end, in an aspect of the present invention, an SPDT switch includes first and second terminals, and first and second FETs with Schottky connection gates. The drain of the first FET and the source of the second FET are connected to the first terminal and the second terminal, respectively, and the source of the first FET and the drain of the second FET are connected to the common terminal. A fixed potential $\gamma$ is applied to the gate of the second FET, and one of potentials $\alpha$ and $\beta$ is applied to the gate of the first FET, where $\alpha<\gamma<\beta$, to allow one of the first and second terminals to be electrically connected to the common terminal. The pinch-off voltage $V_{p1}$ of the first FET is set to satisfy $0>V_{p1}>\alpha-\gamma$, and the pinch-off voltage $V_{p2}$ of the second FET is set to satisfy $0>V_{p2}>\gamma-\beta$.

The SPDT switch may further include a first inductor connected in parallel to the first FET, and a second inductor connected in parallel to the second FET1.

The SPDT switch may further include a first inductor connected in series to the first FET, a first capacitor connected in parallel to the series connection of the first FET and the first inductor, a second inductor connected in series to the second FET, and a second capacitor connected in parallel to the series connection of the second FET and the second inductor.

The SPDT switch may further include a third FET with a Schottky connection gate, having a pinch-off voltage $V_{p3}$ set to satisfy $0>V_{p3}>\gamma-\beta$, and a fourth FET with a Schottky connection gate, having a pinch-off voltage $V_{p4}$ set to satisfy $0>V_{p4}>\alpha-\gamma$. The third FET may have a drain connected to the drain of the first FET, a source connected to ground via a first ground capacitor, and a gate connected to the gate of the second FET. The fourth FET may have a drain connected to the source of the second FET, and a source connected to ground via a second ground capacitor, and a gate connected to the gate of the first FET.

In another aspect of the present invention, a communication unit contains an SPDT switch such as that described above.

An SPDT switch embodied by the present invention can be easily controlled and reduced in size and cost. Furthermore, a communication unit using such an SPDT switch can also be reduced in size and cost.

Other features and advantages of the present invention will become apparent from the following description of the invention which refers to the accompanying drawings, in which like references denote like elements and parts.

DESCRIPTION OF EMBODIMENTS OF THE INVENTION

Figure 1:
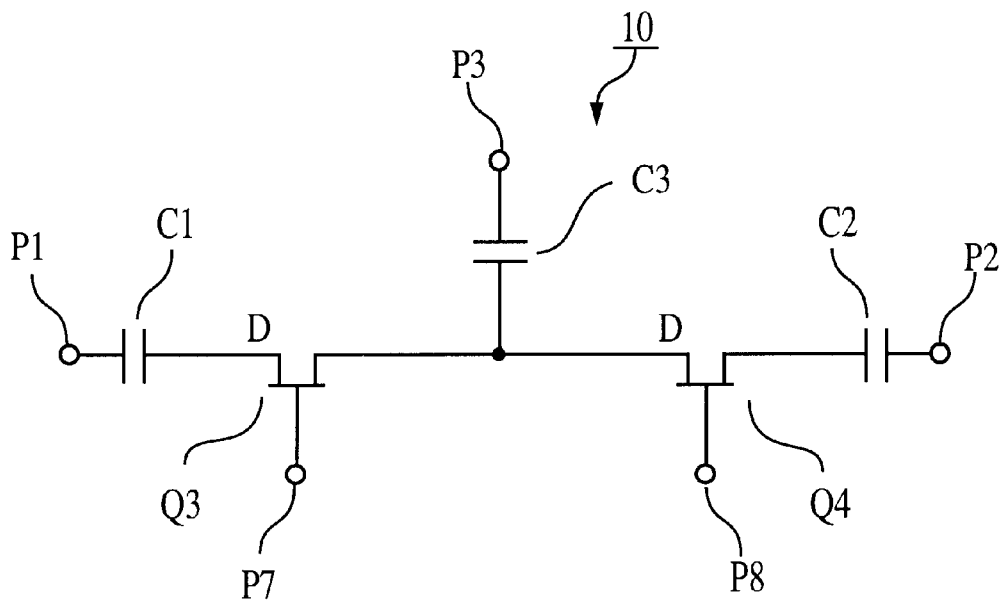
FIG. 1 is a circuit diagram of an SPDT switch according to an embodiment of the present invention.
Figure 7:
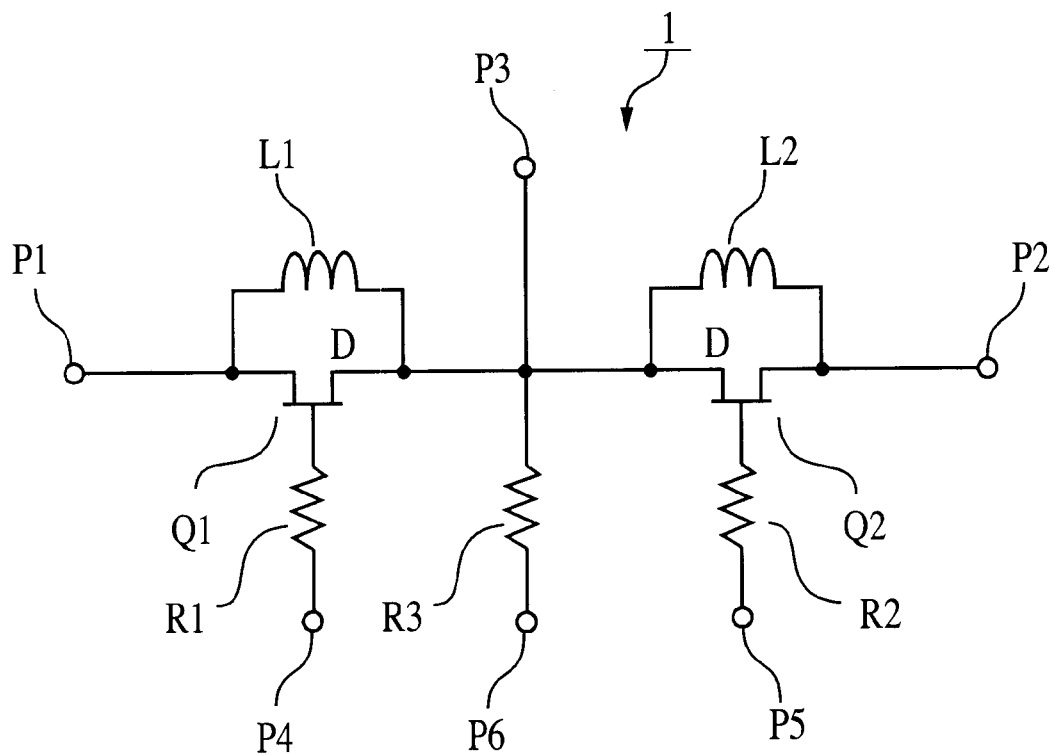
FIG. 7 is a circuit diagram of a conventional SPDT switch.

FIG. 1 shows an SPDT switch according to an embodiment of the present invention. In FIG. 1, the same or like reference numerals are used to designate the same or like elements and components as in FIG. 7.

Referring to FIG. 1, an SPDT switch 10 includes a first terminal $P_1$, a second terminal $P_2$, a common terminal $P_3$, a first field-effect transistor (FET) $Q_3$ having a Schottky connection gate, a second FET $Q_4$ having a Schottky connection gate, capacitors $C_1$, $C_2$, and $C_3$, a first control terminal $P_7$, and a second control terminal $P_8$. The drain of the first FET $Q_3$ is connected to the first terminal $P_1$ via the capacitor $C_1$, and the source of the second FET $Q_4$ is connected to the second terminal $P_2$ via the capacitor $C_2$. The source of the first FET $Q_3$ and the drain of the second FET $Q_4$ are directly connected to each other, and are then connected to the common terminal $P_3$ via the capacitor $C_3$. The gate of the first FET $Q_3$ is connected to the first control terminal $P_7$, and the gate of the second FET $Q_4$ is connected to the second control terminal $P_8$. The capacitors $C_1$, $C_2$, and $C_3$ are coupling capacitors each having low impedance at a signal frequency.

Now, suppose there are three potentials $\alpha$, $\beta$, and $\gamma$ for the operation of the SPDT switch 10, where $\alpha<\gamma<\beta$. Furthermore, suppose the pinch-off voltage $V_{p1}$ of the first FET $Q_3$ is set to satisfy $0>V_{p1}>\alpha-\gamma$, and the pinch-off voltage $V_{p2}$ of the second FET $Q_4$ is set to satisfy $0>V_{p2}>\gamma-\beta$. As a specific example, suppose that $\alpha=0$ V, $\gamma=3$ V, and $\beta=6$ V. Then, the pinch-off voltage $V_{p1}$ of the first FET $Q_3$ is in the range of $0>V_{p1}>-3$ V, and the pinch-off voltage $V_{p2}$ of the second FET $Q_4$ is in the range of $0>V_{p2}>-3$ V. Now, the pinch-off voltages $V_{p1}$ and $V_{p2}$ are set at $V_{p1}=V_{p2}=-0.5$ V.

In operation, a potential of 3 V ($\gamma$) is first applied to the second control terminal $P_8$. Then, a potential of 0 V ($\alpha$) is applied to the first control terminal $P_7$. Since the source of the first FET $Q_3$ and the drain of the second FET $Q_4$ are directly connected to each other, and the gate potential (3 V) of the second FET $Q_4$ is higher than the gate potential (0 V) of the first FET $Q_3$, a potential of 3V, which is equal to the gate potential of the second FET $Q_4$, is obtained at the source of the first FET $Q_3$ and at the drain of the second FET $Q_4$. The drain of the first FET $Q_3$, which is open to a direct current, has a potential of 0 V equal to the associated gate potential. The source of the second FET $Q_4$, which is also open to a direct current, has a potential of 3 V equal to the associated gate potential. Therefore, the gate-source voltage of the first FET $Q_3$ is −3 V. Since the first FET $Q_3$ has a pinch-off voltage $V_{p1}$=−0.5 V, the first FET $Q_3$ is off. On the other hand, the gate-source (gate-drain) voltage of the second FET $Q_4$ is 0 V. Since the second FET $Q_4$ also has a pinch-off voltage $V_{p2}$=−0.5 V, the second FET $Q_4$ is on. Consequently, an electrical connection between the second terminal $P_2$ and the common terminal $P_3$ is established at the signal frequency while no electrical connection occurs between the first terminal $P_1$ and the common terminal $P_3$ at the signal frequency.

Figure 2:
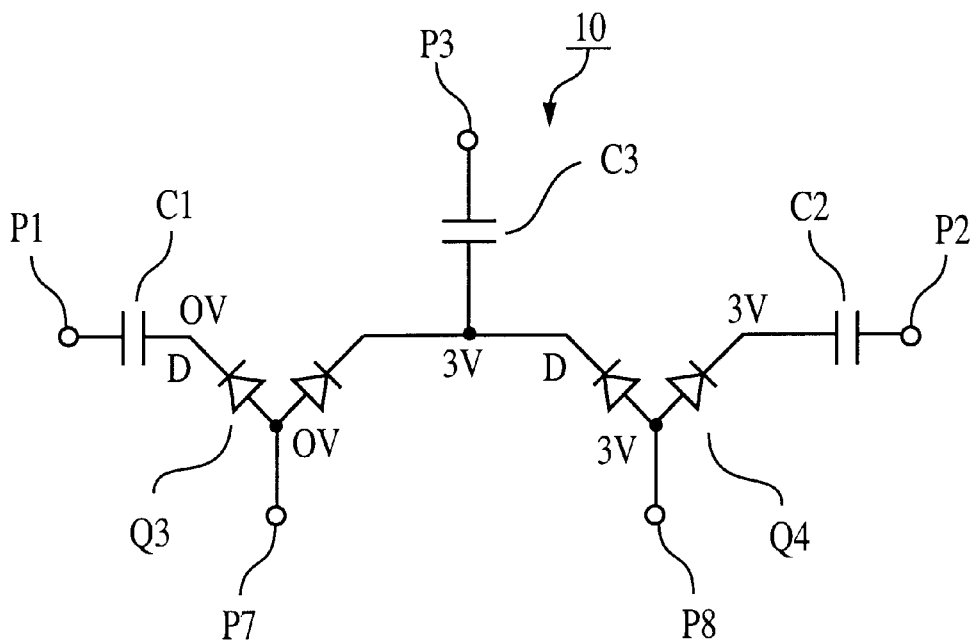
Fig. 2 is an equivalent circuit diagram of the SPDT switch shown in FIG. 1.

For clarification, FIG. 2 shows an equivalent circuit of the first and second FETs $Q_3$ and $Q_4$ using diodes, which illustrates the potential at each of the electrodes of the first and second FETs $Q_3$ and $Q_4$.

As depicted in FIG. 2, each FET having a Schottky connection gate is equivalent to a combination of two diodes having anodes which are connected together and become the gate, and cathodes which become the drain and the source. When a potential of 0 V is applied to the first control terminal $P_7$, the drain of the first FET $Q_3$ also has a potential of 0 V equal to the gate potential. When a potential of 3 V is applied to the second control terminal $P_8$, the source of the second FET $Q_4$ also has a potential of 3 V equal to the gate potential. The potentials of the source of the first FET $Q_3$ and the drain of the second FET $Q_4$, of which the corresponding diodes are supplied with 0 V and 3 V, respectively, are 3 V which is equal to the higher gate potential.

Referring again to FIG. 1, as an alternative, a potential of 6 ($\beta$) may be applied to the first control terminal $P_7$, while a potential of 3 V ($\gamma$) is still applied to the second control terminal $P_8$. In this case, since the gate potential (6 V) of the first FET $Q_3$ is higher than the gate potential (3 V) of the drain and source of the first FET $Q_3$, and at the drain of the second FET $Q_4$, which is equal to the gate potential of the first FET $Q_3$. It will be anticipated that the source of the second FET $Q_4$ still has a potential of 3 V equal to the associated gate potential. Therefore, the gate-source (gate-drain) voltage of the first FET $Q_3$ is 0 V. Since the first FET $Q_3$ still has a pinch-off voltage $V_{p1}$=−0.5 V, the first FET $Q_3$ is on. On the other hand, the gate-drain voltage of the second FET $Q_4$ is −3 V. Since the second FET $Q_4$ also has a pinch-off voltage $V_{p2}$=−0.5 V, the second FET $Q_4$ is off. Consequently, in contrast to the above, an electrical connection between the first terminal $P_1$ and the common terminal $P_3$ is established at the signal frequency while no electrical connection occurs between the second terminal $P_2$ and the common terminal $P_3$ at the signal frequency.

In this way, while the potential to be applied to the control terminal $P_8$ is fixed to 3 V ($\gamma$), one of potentials of 0 V ($\alpha$) and 6 V ($\beta$) is applied to the first control terminal $P_7$, so that the SPDT switch 10 allows either one of the first terminal $P_1$ and the second terminal $P_2$ to be electrically connected to the common terminal $P_3$.

As a result, the SPDT switch 10 only requires a control circuit by which voltages are alternatively applied to either one of the control terminals. This can make an area required for control lines smaller than in the conventional SPDT switch which requires certain potentials to be alternatively applied to two control terminals. Furthermore, the switch 10 only requires one control port such as a CPU, and logic for allowing a control signal to be inverted is no longer necessary. Therefore, an SPDT switch having reduced size and cost and which can be easily controlled is attained.

In the SPDT switch 10, when in the off state, the first FET $Q_3$ and the second FET $Q_4$ still have off-capacitances across the drains and sources, although they are small. Even when the first FET $Q_3$ or the second FET $Q_4$ is off, signals will thus slightly flow through the off-capacitance, which might decrease the isolation.

Figure 3:
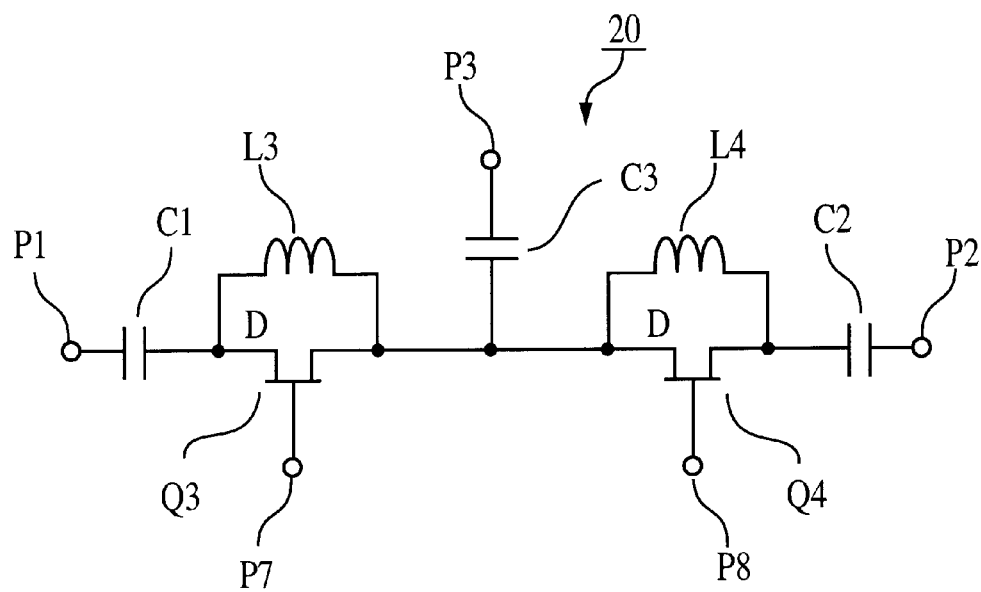
FIG. 3 is a circuit diagram of a modification of the SPDT switch according to the present invention.

FIG. 3 shows a modification of the SPDT switch according the present invention. In FIG. 3, the same or like reference numerals are given to the same or like elements or components as in FIG. 1, and thus the description thereof is omitted.

Referring to FIG. 3, an SPDT switch 20 further includes a first inductor $L_3$ connected across the drain and source of the first FET $Q_3$, and a second inductor $L_4$ connected across the drain and source of the second FET $Q_4$. The inductance of the first inductor $L_3$ is set so that the first inductor $L_3$ may form a parallel resonance with the off-capacitance of the first FET $Q_3$ having a resonant frequency synchronous with the frequency of an undesired signal. The inductance of the second inductor $L_4$ is set so that the second inductor $L_4$ may form a parallel resonance with the off-capacitance of the second FET $Q_4$ having a resonant frequency synchronous with the frequency of an undesired signal.

In the SPDT switch 20 having such a construction, the impedance is extremely low when the FETs are on. When the FETs are off, substantially infinite impedance is obtained by parallel resonance between the off-capacitance and the associated inductors.

Specifically, when the first FET $Q_3$ is on, the first terminal $P_1$ is electrically connected to the common terminal $P_3$ via the first FET $Q_3$. No electrical connection occurs between the second terminal $P_2$ and the common terminal $P_3$ due to infinite impedance by the parallel resonance between the off-capacitance of the second FET $Q_4$ and the second inductor $L_4$.

When the second FET $Q_4$ is on, the second terminal $P_2$ is electrically connected to the common terminal $P_3$ via the second FET $Q_4$. No electrical connection occurs between the first terminal $P_1$ and the common terminal $P_3$ due to infinite impedance by the parallel resonance between the off-capacitance of the first FET $Q_3$ and the first inductor $L_3$.

Therefore, the decreased isolation due to leakage of signals through the off-capacitance of the first FET $Q_3$ or the second FET $Q_4$ can be prevented.

In the SPDT switch 10 or 20 described in conjunction with FIGS. 1 to 3, signals are passed across the drain and source of the first FET $Q_3$ when the first FET $Q_1$ is on, and signals are passed across the drain and source of the second FET $Q_4$ when the second FET $Q_4$ is on. However, the FETs still have an extremely low resistance across the drain and source in the on states, which might cause signal loss.

Figure 4:
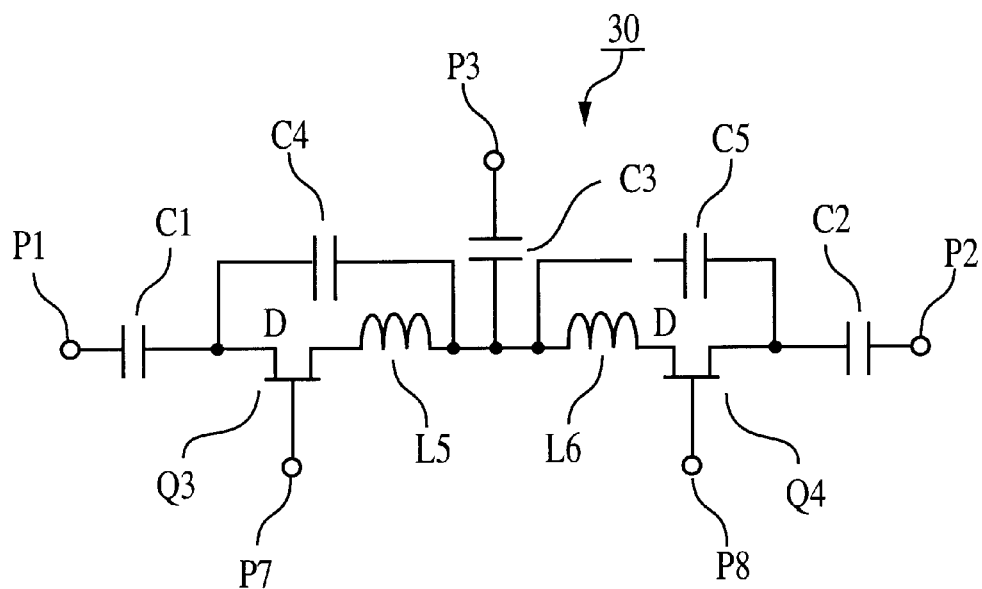
FIG. 4 is a circuit diagram of another modification of the SPDT switch according to the present invention.

FIG. 4 shows a modification of the SPDT switch according to the present invention. In FIG. 4, the same or like reference numerals are given to the same or like elements or components as in FIG. 1, and thus the description thereof is omitted.

Referring to FIG. 4, an SPDT switch 30 further includes a first inductor $L_5$ connected in series to the source of the first FET $Q_3$, and a second inductor $L_6$ connected in series to the drain of the second FET $Q_4$. The SPDT switch 30 also includes a first capacitor $C_4$ connected in parallel to the series connection of the first FET $Q_3$ and the first inductor $L_5$, and a second capacitor $C_5$ connected in parallel to the series connection of the second FET $Q_4$ and the second inductor $L_6$. The inductance of the first inductor $L_5$ is set so that the first inductor $L_5$ may form a series resonance with the off-capacitance of the first FET $Q_3$ having a resonant frequency synchronous with the frequency of a desired signal. The capacitance of the first capacitor $C_4$ is set to coincide with the off-capacitance of the first FET $Q_3$, and is also set so that the first capacitor $C_4$ may form a parallel resonance with the inductor $L_5$ having a resonant frequency synchronous with the frequency of an undesired signal. The inductance of the second inductor $L_6$ is set so that the second inductor $L_6$ may form a series resonance with the off-capacitance of the second FET $Q_4$ having a resonant frequency synchronous with the frequency of a desired signal. The capacitance of the second capacitor $C_5$ is set to coincide with the off-capacitance of the second FET $Q_4$, and is also set so that the second capacitor $C_5$ may form a parallel resonance with the second inductor $L_6$ having a resonant frequency synchronous with the frequency of an undesired signal.

When the first FET $Q_3$ is on, parallel resonance occurs between the first capacitor $C_4$ and the first inductor $L_5$, and series resonance occurs between the off-capacitance of the second FET $Q_4$ and the second inductor $L_6$.

When the second FET $Q_4$ is on, parallel resonance occurs between the second capacitor $C_5$ and the second inductor $L_5$, and series resonance occurs between the off-capacitance of the first FET $Q_3$ and the first inductor $L_5$.

Impedance generated by the series resonance is substantially absent while impedance generated by the parallel resonance is substantially infinite. Therefore, the switch 30 is different from the switches 10 and 20 shown in FIGS. 1 to 3 in this point.

Specifically, when the first FET $Q_3$ is off, an electrical connection is established between the first terminal $P_1$ and the common terminal $P_3$ because of the substantial absence of impedance generated by the series resonance between the off-capacitance of the first FET $Q_3$ and the first inductor $L_5$. Then, no electrical connection occurs between the second terminal $P_2$ and the common terminal $P_3$ because impedance generated by the parallel resonance between the second capacitor $C_5$ and the second inductor $L_6$ is substantially infinite.

When the second FET $Q_4$ is off, an electrical connection is established between the second terminal $P_2$ and the common terminal $P_3$ because of the substantial absence of impedance generated by the series resonance between the off-capacitance of the second FET $Q_4$ and the second inductor $L_6$. Then, no electrical connection occurs between the first terminal $P_1$ and the common terminal $P_3$ because impedance generated by the parallel resonance between the first capacitance $C_4$ and the first inductor $L_5$ is substantially infinite.

Since impedance when an electrical connection is established is substantially absent, because of the use of series resonance between the off-capacitance of the FETs and the associated inductors, the signal loss during electrical connection can be reduced.

Figure 5:
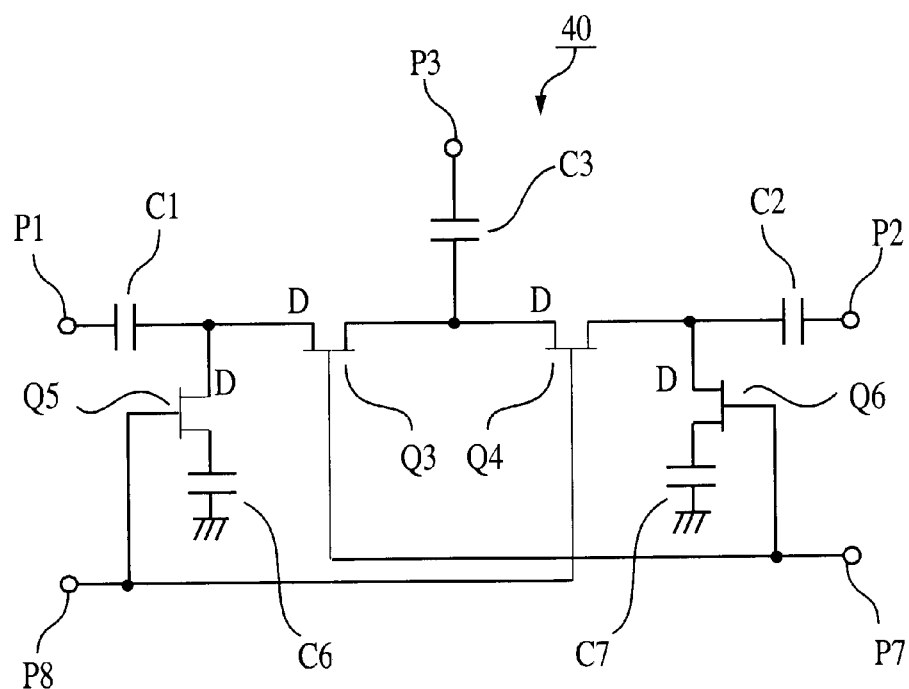
FIG. 5 is a circuit diagram of still another modification of the SPDT switch according to the present invention

FIG. 5 shows another modification of the SPDT switch according to the present invention. In FIG. 5, the same or like reference numerals are given to the same or like elements or components as in FIG. 1, and thus the description thereof is omitted.

Referring to FIG. 5, an SPDT switch 40 additionally includes a third FET $Q_5$ having a Schottky connection gate, a fourth FET $Q_6$ having a Schottky connection gate, a first ground capacitor $C_6$, and a second ground capacitor $C_7$. The third FET $Q_5$ has a drain connected to the drain of the first FET $Q_3$ and a source connected to ground via the first ground capacitor $C_6$. The gate of the third FET $Q_5$ is connected to the gate of the second FET $Q_4$. The fourth FET $Q_6$ has a drain connected to the source of the second FET $Q_4$ and a source connected to ground via the second ground capacitor $C_7$. The gate of the fourth FET $Q_6$ is connected to the gate of the first FET $Q_3$. The pinch-off voltage $V_{p3}$ is set to satisfy $0>V_{p3}>\gamma-\beta$, as is the pinch-off voltage $V_{p2}$ of the second FET $Q_4$, and the pinch-off voltage $V_{p4}$ of the fourth FET $Q_6$ is set to satisfy $0>V_{p4}>\alpha-\gamma$, as is the pinch-off voltage $V_{p1}$ of the first FET $Q_3$. Also, $V_{p3}=V_{p4}=-0.5$ V may be set, which corresponds to the pinch-off voltages $V_{p1}$ and $V_{p2}$ of the first FET $Q_3$ and the second FET $Q_4$ in the SPDT switch 10 shown in FIGS. 1 and 2. The first and second ground capacitors $C_6$ and $C_7$ are coupling capacitors each having low impedance at signal frequencies.

In the SPDT switch 40 having such a construction, supposing that a potential of 3 V ($\gamma$) is applied to the second control terminal $P_8$ and a potential of 0 V ($\alpha$) is applied to the first control terminal $P_7$, the first FET $Q_3$ has potentials of 0 V, 3 V, and 3 V at the gate, the drain, and the source, respectively, and is turned off. The second FET $Q_4$ has potentials of 3 V, 3 V, and 3 V at the gate, the drain, and the source, respectively, and is turned on. The third FET $Q_5$ has potentials of 3 V, 3 V, and 3 V at the gate, the drain, and the source, respectively, and is turned on. The fourth FET $Q_6$ has potentials of 0 V, 3 V, and 0 V at the gate, the drain, and the source, respectively, and is turned off. In short, the first and fourth FETs $Q_3$ and $Q_6$ are off, and the second and third FETs $Q_4$ and $Q_5$ are on. In this context, an electrical connection is established between the second terminal $P_2$ and the common terminal $P_3$ since the second FET $Q_4$ is on, and no electrical connection occurs between the first terminal $P_1$ and the common terminal $P_3$ since the first FET $Q_3$ is off. Since the third FET $Q_5$ is in conduction, the drain of the third FET $Q_5$ or the drain of the first FET $Q_3$ is grounded at high frequencies. This inhibits signals from passing between the first terminal $P_1$ and the common terminal $P_3$ through the off-capacitance of the first FET $Q_3$, thus increasing the isolation.

In turn, supposing that a potential of 3 V ($\gamma$) is applied to the second control terminal $P_8$ and a potential of 6 V ($\beta$) is applied to the first control terminal $P_7$, the first FET $Q_3$ has potentials of 6 V, 6 V, and 6 V at the gate, the drain, and the source, respectively, and is turned on. The second FET $Q_4$ has potentials of 3 V, 6 V, and 6 V at the gate, the drain, and the source, respectively, and is turned off. The third FET $Q_5$ has potentials of 3 V, 6 V, and 3 V at the gate, the drain, and the source, respectively, and is turned off. The fourth FET $Q_6$ has potentials of 6 V, 6 V, and 6 V at the gate, the drain, and the source, respectively, and is turned on. In short, the first FET $Q_3$ and the fourth FET $Q_6$ are on, and the second FET $Q_4$ and the third FET $Q_5$ are off. In this context, an electrical connection is established between the first terminal $P_1$ and the common terminal $P_3$ since the first FET $Q_3$ is on, and no electrical connection occurs between the second terminal $P_2$ and the common terminal $P_3$ since the FET $Q_4$ is off. Since the fourth FET $Q_6$ is in conduction, the drain of the fourth FET $Q_6$ or the source of the second FET $Q_4$ is grounded at high frequencies. This inhibits signals from passing between the second terminal $P_2$ and the common terminal $P_3$ through the off-capacitance of the second FET $Q_4$, thus increasing the isolation.

Accordingly, the SPDT switch 40 is advantageous in that the isolation is increased.

Typically, in FETs having Schottky connection gates, drains and sources are substantially symmetrical in structure with respect to the gates, and drains and sources may be used interchangeably. In the illustrated embodiment, drains and sources of the FETs are not necessarily fixed, but may be interchangeable, attaining similar operational advantages. It will be appreciated that the connections of the drains and the sources of the FETs in the present invention are not exhaustive and other types may also fall within the scope of the invention.

Since the drains and the sources of FETs may be interchanged, the present invention is not limited to the case in which a certain fixed potential is applied to the second control terminal $P_8$ and one of two potentials is applied to the first control terminal $P_7$. A certain fixed potential may also be applied to the first control terminal $P_7$ while one of two potentials is applied to the second control terminal $P_8$. Either case provides the same operational advantages.

As will be anticipated from the foregoing embodiment, both the first and second control terminals $P_7$ and $P_8$ are connected to the gates of the first and second FETs $Q_3$ and $Q_4$, respectively, and no current flows. Potentials to be applied to FETs may be obtained by an approach in which more than one DC power supply are connected in series so that potentials $\alpha$, $\gamma$, and $\beta$ may be obtained. In another approach, voltages may be divided by resistance from a DC power supply having a potential exceeding $\beta$ to obtain the potentials $\alpha$, $\gamma$, and $\beta$.

Figure 6:
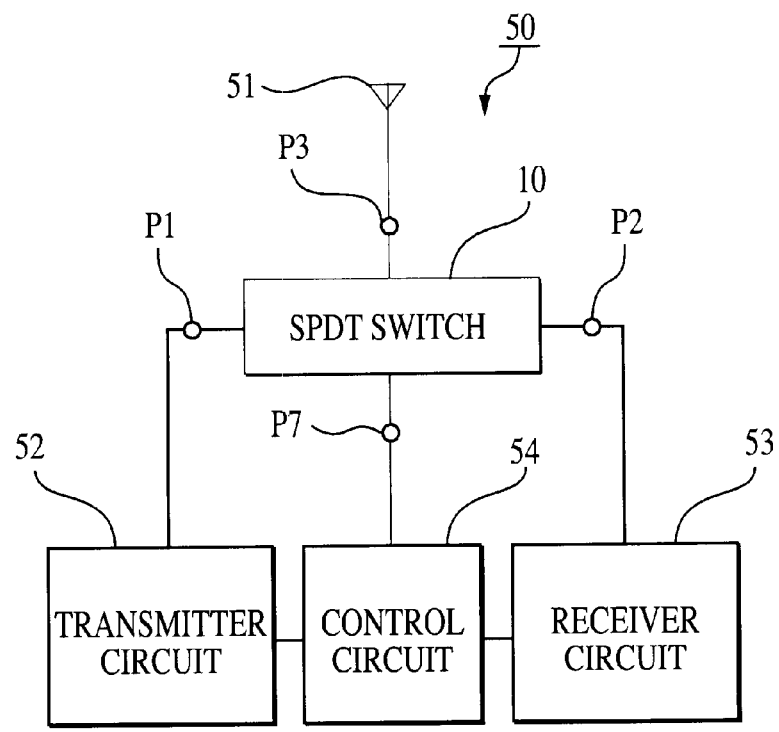
FIG. 6 is a block diagram of a communication unit according to an embodiment of the present invention.

FIG. 6 is a block diagram showing a communication unit in accordance with an embodiment of the present invention.

Referring to FIG. 6, a communication unit 50 includes an antenna 51, the SPDT switch 10 shown in FIG. 1, a transmitter circuit 52, a receiver circuit 53, and a control circuit 54. The antenna 51 is connected to the common terminal $P_3$ of the SPDT switch 10 employed as an antenna switch. The first terminal $P_1$ and second terminal $P_2$ of the SPDT switch 10 are connected to the transmitter circuit 52 and the receiver circuit 53, respectively. The transmitter circuit 52 and the receiver circuit 53 are connected to the control circuit 54, and the control circuit 54 is connected to the first control terminal $P_7$ of the SPDT switch 10. Although not shown, a predetermined fixed potential is applied to the second control terminal $P_8$ of the SPDT switch 10.

The control circuit 54 in the communication unit 50 switches the potentials to be applied to the first control terminal $P_7$ of the SPDT switch 10 so that the antenna 51 may be coupled to the transmitter circuit 52 for transmission or coupled to the receiver circuit 53 for reception.

The SPDT switch 10 of the present invention, which is used as an antenna switch, can reduce the size and cost of the communication unit 50.

A communication unit typically requires less electrical power for reception than for transmission. The SPDT switch used as an antenna switch for a communication unit is thus set so that the FET through which transmission signals pass in its on state has a higher power tolerance than that of the FET through which reception signals pass in its on state. This can prevent over-specification of the SPDT switch, further reducing the cost of the overall communication unit.

While the communication unit 50 shown in FIG. 6 includes the SPDT switch 10, the SPDT switch 20, 30 or 40 shown in FIG. 3, 4 or 5 may be instead contained in the communication unit 50. Some of these SPDT switches may increase the isolation, and may reduce signal loss or electric power consumption while attaining the same operational advantages.

Although the present invention has been described in relation to particular embodiments thereof, many other variations and modifications and other uses will become apparent to those skilled in the art. Therefore, the present invention is not limited by the specific disclosure herein.

What is claimed is:

1. An SPDT switch comprising:
   a first terminal;
   a second terminal;
   a common terminal; and
   first and second FETs each having two respective main terminals and respective Schottky connection gates;
   wherein one main terminal of said first FET and one main terminal of said second FET are connected to said first terminal and said second terminal, respectively;
   the other main t terminal of said first FET and the other main terminal of said second FET are connected to said common terminal;
   a fixed potential γ is applied to the gate of said second FET, and one of potentials α and β are applied to the gate of said first FET without changing the fixed potential applied to the gate of said second FET, where α<γ<β, to allow one of said first and second terminals to be electrically connected to said common terminal; and
   the pinch-off voltage $0>V_{p1}>\alpha-\gamma$, and the pinch-off voltage $V_{p2}$ of said second FET is set to satisfy $0>V_{p2}>\gamma-\beta$.

2. An SPDT switch according to claim 1, further comprising:
   a first inductor connected in parallel to said first FET; and
   a second inductor connected in parallel to said second FET.

3. An SPDT switch according to claim 1, further comprising:
   a first inductor connected in series to said first FET;
   a first capacitor connected in parallel to the series connection of said first FET and said first inductor;
   a second inductor connected in series to said second FET; and
   a second capacitor connected in parallel to the series connection of said second FET and said second inductor.

4. An SPDT switch according to claim 1, further comprising:
   a third FET having two main terminals and a Schottky connection gate, having a pinch-off voltage $V_{p3}$ set to satisfy $0>V_{p3}>\gamma-\beta$; and
   a fourth FET having two main terminals and a Schottky connection gate, having a pinch-off voltage $V_{p4}$ set to satisfy $0>V_{p4}>\alpha-\gamma$,
   wherein said third FET has one main terminal connected to said one main terminal of said first FET, the other main terminal connected to ground via a first ground capacitor, and a gate connected to the gate of said second FET; and
   said fourth FET has one main terminal connected to said one main terminal of said second FET, the other main terminal connected to ground via a second ground capacitor, and a gate connected to the gate of said first FET.

5. A communication unit including an SPDT switch according to any of claims 1 to 4;
   a transmitter circuit connected to one of said first and second terminals;
   a receiver circuit connected to the other of said first and second terminals; and
   a control circuit connected to said gate of said first FET for applying thereto said one of said potentials α and β.

* * * * *